United States Patent
Basceri

(10) Patent No.: US 6,352,866 B1
(45) Date of Patent: *Mar. 5, 2002

(54) METHOD FOR IMPROVING THE SIDEWALL STOICHIOMETRY OF THIN FILM CAPACITORS

(75) Inventor: Cem Basceri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/745,936

(22) Filed: Dec. 26, 2000

Related U.S. Application Data

(62) Division of application No. 09/228,293, filed on Jan. 8, 1999, now Pat. No. 6,194,229.

(51) Int. Cl.$^7$ .......................................... H01L 21/8242
(52) U.S. Cl. .......................... 438/3; 438/240; 438/252; 438/256; 438/390; 438/395; 438/399; 438/778
(58) Field of Search .................... 438/3, 240, 250–256, 438/381, 390–399, 778; 257/295, 296

(56) References Cited

U.S. PATENT DOCUMENTS

| | | |
|---|---|---|
| 5,453,908 A | 9/1995 | Tsu et al. |
| 5,618,761 A | 4/1997 | Eguich et al. |
| 6,194,229 B1 * | 2/2001 | Basceri .......................... 438/3 |

FOREIGN PATENT DOCUMENTS

EP  0 380 326  8/1990

OTHER PUBLICATIONS

H. Yamawaki et al, "Ultra Thin SrBi$_2$ Ta$_2$O$_9$ Ferroelectric Films Grown by Liquid Source CVD Using BiOx Buffer Layers," Abstracts of the 1998 International Conference on Solid State Devices and Materials, Hiroshima, 1998, pp. 102–103.

* cited by examiner

*Primary Examiner*—Chandra Chaudhari
*Assistant Examiner*—Lisa Kilday
(74) *Attorney, Agent, or Firm*—Dickstein Shapiro Morin & Oshinsky LLP

(57) ABSTRACT

A method for ion implantation of high dielectric constant materials with dopants to improve sidewall stoichiometry is disclosed. Particularly, the invention relates to ion implantation of (Ba,Sr)TiO$_3$ (BST) with Ti dopants. The invention also relates to varying the ion implantation angle of the dopant to uniformly dope the high dielectric constant materials when they have been fabricated over a stepped structure. Additionally, the invention relates to forming a capping layer over a horizontal portion of the BST film to reduce excess dopant from being implanted into the horizontal section of the BST film. The invention also relates to integrated circuits having a thin film high dielectric material with improved sidewall stoichiometry used as an insulating layer in a capacitor structure.

17 Claims, 3 Drawing Sheets

METHOD FOR IMPROVING THE SIDEWALL STOICHIOMETRY OF THIN FILM CAPACITORS

This application is a divisional of application Ser. No. 09/228,293, filed on Jan. 8, 1999, now U.S. Pat. No. 6,194,229, which is hereby incorporated by reference.

FIELD OF THE INVENTION

The invention relates generally to ion implantation of high dielectric constant materials with dopants to improve the sidewall stoichiometry of high dielectric thin films deposited over 3-D formations. Particularly, the invention relates to ion implantation of Ti into a $(Ba,Sr)TiO_3$ (BST) film by varying the implantation angle of the dopant to improve the sidewall stoichiometry the BST film. The invention also relates to integrated circuits having a doped thin film high dielectric material, used, for example, as an insulating layer in a capacitor.

BACKGROUND OF THE INVENTION

High dielectric constant (HDC) materials have many microelectronic applications, such as DRAMs, embedded DRAMs, SRAMs, FeRAMS, on-chip capacitors and high frequency capacitors. Typically, these applications employ HDC materials in a capacitive structure, although the present invention may be used to make an HDC thin film with improved properties which is not part of a capacitor.

To facilitate construction of larger DRAMs with correspondingly smaller memory cells, capacitor structures and materials which can store the necessary charge in smaller spaces are needed. One of the most promising avenues of research to achieve this goal is the area of HDC materials. HDC materials have dielectric constants of greater than about 50. Examples of particular HDC materials are metal oxide materials such as, lead zirconate titanate (PZT), barium titanate ($BaTiO_3$), strontium titanate ($SrTiO_3$), and barium strontium titanate (BST). It is desirable that such a material, if used for DRAMs and other microelectronics applications, be formable over an electrode and underlying structure (without significant harm to either), have low leakage current characteristics and long lifetime, and, for most applications, possess a high dielectric constant. The present invention relates to a method of forming a HDC film, for example, a BST dielectric film, with improved sidewall stoichiometry.

While BST materials have been manufactured in bulk form previously, the physical and electrical properties of the material is not well understood when BST is formed as a thin film (generally less than 5 um) on a semiconducting device. Methods to form the $(Ba,Sr) TiO_3$ material include deposition by a metal organic chemical vapor deposition (MOCVD) process using appropriate precursors. Typical MOCVD deposition of BST utilizes the precursors of Ba(bis (2,2,2,6-tetramethyl-3,5-heptanedionate))$_2$-tetraethylene glycol dimethyl ether; Sr(bis(2,2,2,6-tetramethyl-3,5-heptanedionate)) $_2$-tetraethylene glycol dimethyl ether and Ti(bis(isopropoxy))$_2$bis(2,2,2,6-tetramethyl-3,5-heptanedionate)$_2$. A liquid delivery system mixed, metered and transported the precursors at room temperature and high pressure to a heated zone, where the precursors were then flash vaporized and mixed with a carrier gas, typically argon, to produce a controlled temperature, low pressure vapor stream. The gas stream was then flowed into a reactor mixing manifold where the gas stream mixed with oxidizer gases. Typically the oxidizer gases were $O_2$ and $N_2O$. The mixture of the gas stream and the oxidizer gases then passed through a shower head injector into a deposition chamber. In the MOCVD deposition, both the ratio of the concentrations of the metalorganic compounds in the vaporized liquid and the deposition conditions determine the final film stoichiometry. However, the MOCVD BST deposition process suffers from the inhomogeneity in stoichiometry (A:B site ratio) on 3-D structures.

In addition, in submicron microcircuits such as DRAM capacitors, particular constraints are placed on BST thin film. First, the annealing temperature for BST thin films must generally be kept far below the temperatures commonly used for sintering bulk BST ceramics (generally less than 700° C. vs. typically greater than 1100° C. for bulk BST) to avoid damage to the underlying device structure. Thus, the grain nucleation and growth kinetics of the BST crystal lattice is inhibited resulting in smaller grain sizes. Second, the desired film thickness in microelectronic applications may be much less than 5 un (preferably between about 0.05 um and about 0.1 um). It has been found that median grains sizes generally less than half the BST film thickness are required to control dielectric uniformity and avoid shorted capacitors. Finally, when a BST film is formed in a microelectronic application such as a container or a stud, the sidewall components of the film generally contains less titanium than is present in the horizontal components of the container or stud formation. The percentage of titanium in the film is critical to the physical end electrical functionality of the film. It has been shown that the titanium must be between about 50% to about 53.5% of the BST film in order for the film to have beneficial physical and electrical properties Thus, a method for producing a HDC material such as BST in a thin film structure having good dielectric properties and uniform titanium content is needed.

SUMMARY OF THE INVENTION

The present invention overcomes the drawbacks of the conventional methods and provides an ion implanted high dielectric constant material having improved sidewall stoichiometry. Particularly, the present invention overcomes the observed Ti-stoichiometry variation on the sidewalls of 3-D structures for MOCVD (BST) thin film capacitors. The inventor has observed that MOCVD BST thin films exhibit a deviation in A:B site ratio on the sidewalls of the trench or stud type structures. Typically, at these regions, at %Ti in the thin film is less than the desired value. The present invention overcomes these problems by implanting Ti ions by ion implantation after MOCVD process of BST. With this technique, it is possible to tailor the Ti composition in BST films, preferably on the sidewalls, by appropriate ion implantation angles.

The present invention also provides a method for tailoring the sidewall stoichiometry by providing a capping layer over the 3-D structure before Ti ion implantation thereby adjusting the sidewall stoichiometry of the BST film with ion implantation by varying the implantation angles.

The above and other advantages and features of the invention will be more clearly understood from the following detailed description which is provided in connection with the accompanying drawings.

DETAILED DESCRIPTION OF THE PREFERRED EMBODIMENTS

Figure 1:
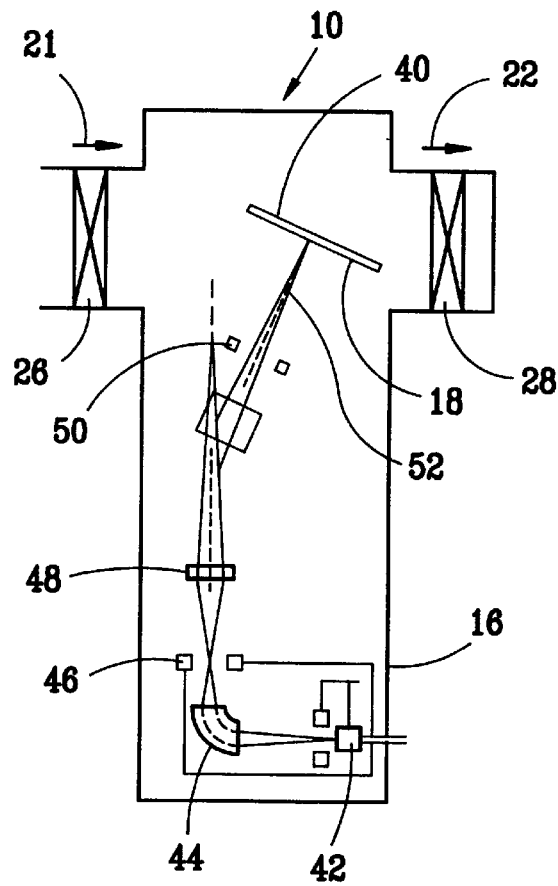
FIG. 1 is a schematic view of one embodiment of an apparatus used in the present invention.

The terms wafer or substrate used in the description include any semiconductor-based structure having an exposed silicon surface in which to form the contact electrode structure of this invention. Wafer and substrate are to be understood as including silicon-on insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation. It should also be understood that the term wafer or substrate may relate to a base semiconductor structure having undergone processing steps to arrive at a semiconductor platform which may undergo further processing.

The term "metal oxide" or "high dielectric constant material (HDC)" used herein means a material of the general form $ABO_3$ where A and B are cations. The term is intended to include materials were A and B represent multiple elements; for example, it includes materials of the form $A'A''BO_3$, $AB'B''O_3$, and $A'A''B'B''O_3$, where A', A", B'and B" are different metal elements. Preferably, A, A", A", are metals selected from the group of metals consisting of Ba, Bi, Sr, Pb, Ca, and La, and B, B', and B" are metals selected from the group consisting of Ti, Zr, Ta, Mo, W, and Nb. Preferably the metal oxide is a perovskite. Many of these metal oxides are ferroelectrics; however the present invention is not so limited.

As will be understood by those skilled in the art, most crystalline materials having an $ABO_3$ formula are perovskite crystalline compounds. These structures ideally have a unit cell forming a simple cubic structure including A-type cations at the corners of a cube, a B-type cation at the centroid of the cube, and oxygen atoms entered at each facial plane of the cube; however, this idealized structure may vary considerably with temperature. Other forms of perovskite-type compounds can be classified, for example, as orthombic, pseudocubic, pseudotetragonal, rombohedral, and tetragonal.

Some materials falling within the class of $ABO_3$, such as barium strontium titanate (BST) exhibit electrical properties that are often very different when measured from bulk ceramics, as compared to the thin film materials (i.e., those less than about ten microns thick) that are used in integrated circuits. Bulk ceramics are typically sintered at temperatures reaching from 1400° C. to 1500° C., and this high temperature tends to produce a correspondingly high degree of defect-free crystallization. On the other hand, thin films are generally not sintered above about 900° C. to 1100° C. due to the potential for breakdown of integrated circuit wiring, layer interdiffusion, and cracking. Thin films are most often deposited by conventional sputtering techniques, e.g., radio frequency or DC magnetron sputtering. On a microscopic level, these techniques can provide clumped areas of massed materials having nonuniform -thicknesses, stratified layers that are improperly mixed to non-homogeneic proportions that are incapable of forming proper average crystals according to the mixture of ingredients. Accordingly, those attempting to replicate bulk ceramic behavior in thin film electronic components have often been unable to duplicate these parameters, even if the electron transfer mechanism remains the same between the two thicknesses of materials.

The Ba/Sr ratio of BST should be about 70/30 allowing the material to operate in the paraelectric region for DRAM applications since this will reduce the complexity of understanding the material's response. Therefore, the importance of Ba/Sr ratio in the BST material is controlling the curie temperature (Tc) to be nearly room temperature, thus giving the material the advantage of having a high dielectric constant since the dielectric constant exhibits a peak near Tc while allowing the material to be in the paraelectric region for the operating temperature of the DRAM cell. By maintaining a Ba/Sr ratio of about 70/30, the danger of shifting to ferroelectric state by a possible shift in temperature (less than room temperature) is eliminated. This is because the material exhibits a curie-point at room temperature for Ba/Sr: 70/30, but does not go to the ferroelectric phase until temperatures of about 190° K.

Additionally, it is important that the percentage of Ti in the BST thin film is between about 50% and about 53.5%. When the percentage of Ti, in the BST thin film is outside this range, the BST thin film will exhibit poor. physical and electrical properties. For example, when the percentage of Ti in the BST thin film is outside the prescribed range, the BST thin film will exhibit a poor dielectric constant and also will exhibit increased current leakage.

Since the stoichiometry of BST formed on the sidewalls of trenches can deviate from the target values, it is necessary to maintain the stoichiometry at the sidewalls. This becomes a serious issue for deep trenches (e.g., 10:1 aspect ratios) since properties such as dielectric constant, leakage, relaxation and resistance degradation will deviate at the sidewalls from other locations on a semiconductor. With the present invention sidewalls can be doped to achieve the desired stoichiometries by using appropriate implant angles. Thus, with appropriate doping levels, sidewall stoichiometries can be tailored to achieve desired physical properties. molecular pump. This generates a vacuum within the process chamber of the ion implanter 16. With this arrangement an ion implant beam 52 is focused on the high dielectric constant thin film on the surface of the wafer 18 for implanting a desired dopant (such as, for example, Ba, Bi, Sr, Pb, Ca, and La for the A site and Ti, Zr, Ta, Mo, W, and Nb for the B-site based on the particular HDC material) into the crystal lattice structure of the high dielectric constant thin film. After ion implantation the wafer 18 is transferred from the wafer holder 40 to another transport channel 28. At the transport channel 28, the wafer 18 is discharged from the system 10.

Figure 2:
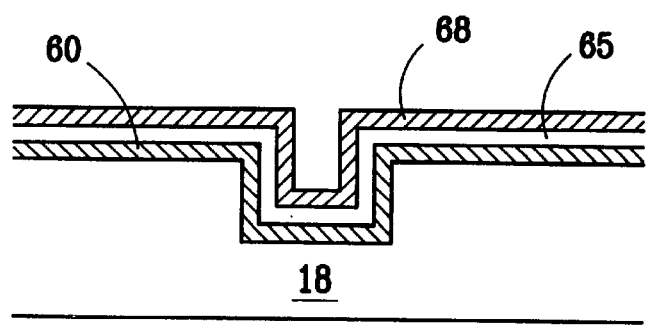
FIG. 2 is a cross-sectional view of a container capacitor formed according to the present invention.

At this point, the wafer 18 has a conductive layer 60 formed of a suitable conductive material with a doped dielectric film layer 65 formed over the conductive layer 60. A second conductive layer 68 is then formed over doped dielectric film layer 65 to form the container capacitor structure as shown in FIG. 2. The conductive layers 60, 68 may be formed of any conductive material such as metals, i.e., Pt, Ru, Ir, Pd, Au or conductive oxides such as a ruthenium oxide ($RuO_x$) or an iridium oxide ($IrO_x$). The doped dielectric film layer 65 is formed by doping a HDC material as described above.

Figure 3:
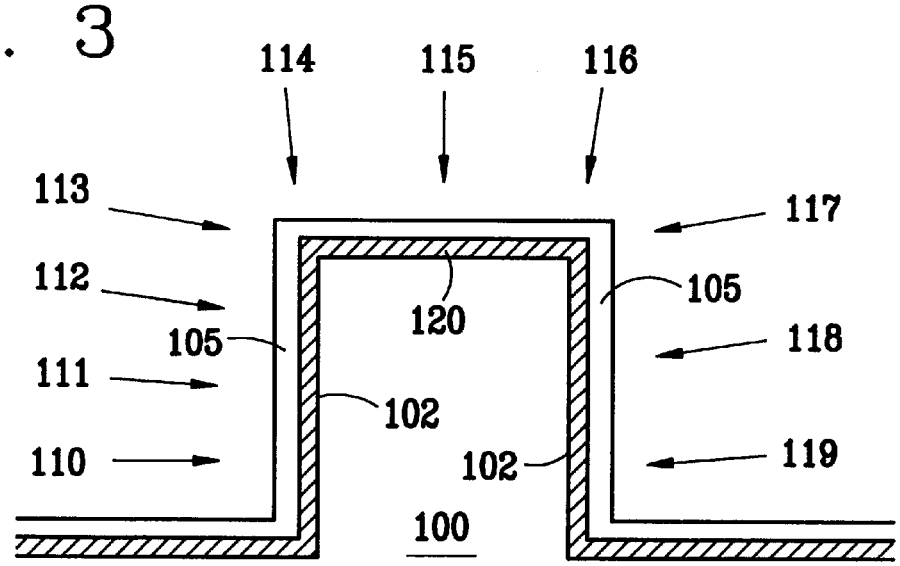
FIG. 3 is a cross-sectional view of an ion implantation of the sidewalls of a semiconductor device having a stud formation.

Reference is now made to FIG. 3. This figure shows a representative view of a stud capacitor formation according to the present invention. Dopant levels of the HDC film, such as BST, formed on the sidewalls 102 of a stud 100 can deviate from the target values. This becomes a serious issue for deep trenches (e.g., 10:1 aspect ratios) or studs as shown in FIG. 3 since properties such as dielectric constant and leakage Will deviate at the sidewalls from the values for these properties in the horizontal portions of the device. According to the present invention the HDC, e.g. BST, dielectric layer 105 formed over a conductive layer 120 on the sidewalls 102 can be doped to achieve the desired stoichiometries by appropriate implant angles 110–119 by appropriate movement of wafer holder 40. A second electrode (not shown) may then be formed over the HDC, e.g. BST, layer 105 to arrive a capacitor structure. Thus, with appropriate doping levels, the HDC layer 105 overlying the conductive layer 120 on sidewalls 102 can be tailored to achieve desired physical properties.

Figure 4:
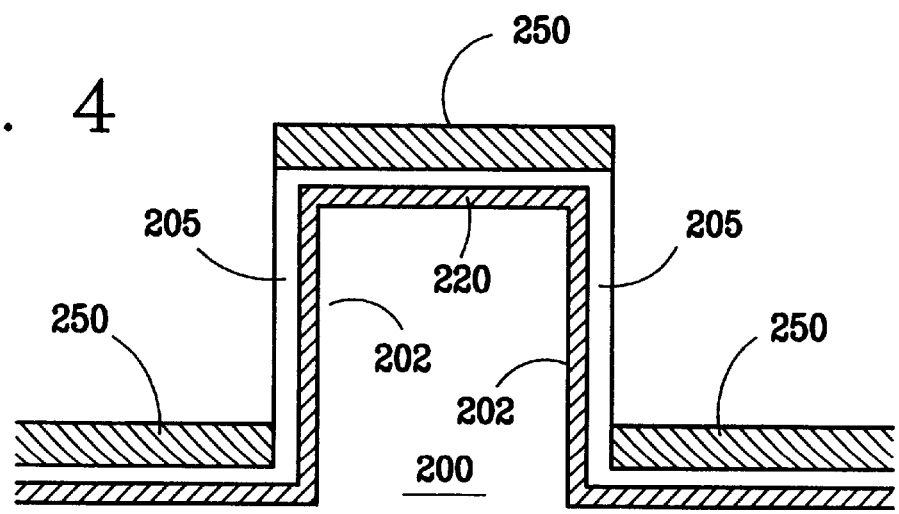
FIG. 4 is a cross-sectional view of an ion implantation of the sidewalls of a semiconductor device having a stud formation according to a second embodiment of the present invention.
Figure 5:
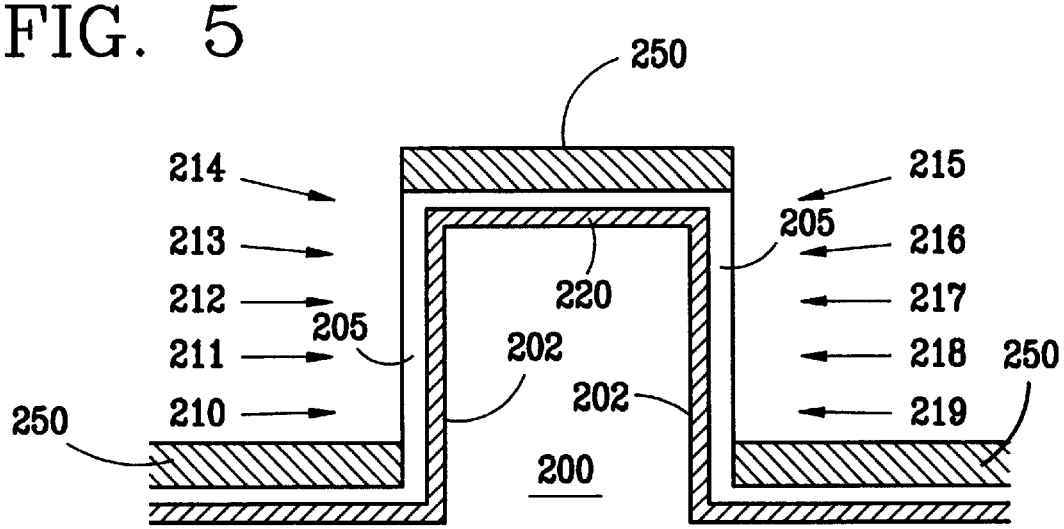
FIG. 5 is a cross-sectional view of an ion implantation step of a portion of a semiconductor device having a stud formation at a processing step subsequent to that shown in FIG. 4.
Figure 6:
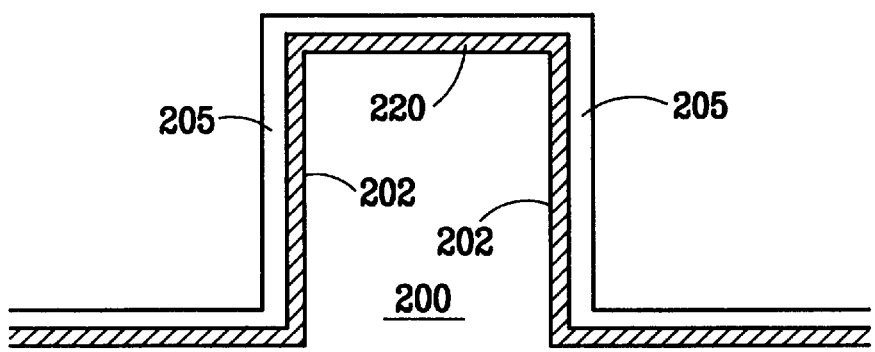
FIG. 6 is a cross-sectional view of an ion implantation step of a portion of a semiconductor device having a stud formation at a processing step subsequent to that shown in FIG. 5.

Reference is now made to FIG. 4. This figure shows a representative view of a second embodiment of the present invention. Dopant levels of BST formed on the sidewalls 202 of a stud 200 can deviate from the target values. This becomes a serious issue for deep trenches (e.g., 10:1 aspect ratios) or studs as shown in FIGS. 4–6 since properties such as dielectric constant and leakage will deviate at the sidewalls from the values for these properties in the horizontal portions of the device. A passivation layer 250 is deposited over the horizontal sections of the stud 200 as shown in FIG. 4. The passivation layer 250 may be formed of any material such that the BST dielectric layer 205 formed under the passivation layer 250 is significantly shielded form ion implantation.

Reference is now made to FIG. 5. According to the second embodiment of the present invention the BST dielectric layer 205 formed over a conductive layer 220 on the sidewalls 202 can be doped to achieve the desired stoichiometries by appropriate implant angles 210–219. The appropriate movement of wafer holder 40, as shown in representative apparatus in FIG. 1, is used to effectuate the appropriate implant angels 210–219. The passivation layer 250 prevents dopant from being implanted into the BST film that overlies the horizontal regions of the stud 200.

The passivation layer 250 is then removed from the horizontal surfaces of the stud 200 as shown in FIG. 6. A second electrode (not shown) may then be formed over BST layer 205 to arrive at a capacitor structure. Thus, with appropriate doping levels, the BST layer 205 overlying the conductive layer 220 on sidewalls 202 can be tailored to achieve desired physical properties.

The present invention provides a method for ion implantation of HDC materials with dopants to reduce film leakage and improve resistance degradation. The invention also provides a method for varying the ion implantation angle of the dopant to uniformly dope the high dielectric constant materials when they have been fabricated over a stepped structure.

It should again be noted that although the invention has been described with specific reference to DRAM memory circuits and container capacitors, the invention has broader applicability and may be used in any integrated circuit, such as, for example in a capacitor. Similarly, the process described above is but one method of many that could be used. Furthermore, although the invention has been described with reference to BST as a preferred HDC material which can be used in the invention, the invention has more widespread applicability to any HDC material. Accordingly, the above description and accompanying drawings are only illustrative of preferred embodiments which can achieve the features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A method for fabricating a high capacitance thin film integrated circuit capacitor device, said method comprising:

provideing a substrate having a first level and a second level, wherein said first and second levels are connected by a sidewall region between said first and second levels;

forming a first electrode on said substrate;

forming a BST high dielectric constant thin film material on said first electrode;

doping said BST high dielectric thin film material with a dopant by ion implantation, wherein said BST high dielectric thin film material is doped to maintain the stoichiometry of said BST high dielectric thin film material; and forming a second electrode on said BST high capacitance thin film layer to complete said integrated circuit capacitor.

2. The method according to claim 1, wherein said BST high dielectric thin film material is doped by varying the implant angle of the dopant.

3. The method according to claim 2, wherein said dopants are selected from the group consisting of barium, strontium and titanium.

4. The method according to claim 3, wherein said BST high dielectric thin film material is doped with a dopant selected from the group consisting of Ba, and Sr.

5. The method according to claim 3, wherein said BST high dielectric thin film material is doped with Ti.

6. The method according to claim 5, wherein said BST high dielectric thin film material is doped with Ti to maintain a Ti percentage of from about 50% to about 53.5% throughout said BST high dielectric thin film material.

7. The method according to claim 6, wherein the ratio of Ba to Sr is about 70:30.

8. The method according to claim 2, wherein said first and second electrodes are selected from the group consisting of Pt, Ru, Ir, Pd, Au ruthenium oxides, and iridium oxides.

9. The method according to claim 2, wherein said integrated circuit capacitor is fabricated in a DRAM cell.

10. A method for fabricating a high capacitance thin film integrated circuit capacitor device, said method comprising:

providing a substrate having a first level and a second level, wherein said first and second levels are connected by a sidewall region between said first and second levels;

forming a first electrode on said substrate;

forming a BST high dielectric constant thin film material on said first electrode;

forming a capping layer over said first and second levels of said BST high dielectric constant thin film material;

doping said BST high dielectric thin film material formed on said sidewalls with a dopant by ion implantation, wherein said BST high dielectric thin film material is doped by varying the ion implantation implant angle to maintain the stoichiometry of said BST high dielectric thin film material; and removing said capping layer and forming a second electrode on said BST high capacitance thin film layer to complete said integrated circuit capacitor.

11. The method according to claim 10, wherein said dopants are selected from the group consisting of barium, strontium and titanium.

12. The method according to claim 11, wherein said BST high dielectric thin film material is doped with a dopant selected from the group consisting of Ba, and Sr.

13. The method according to claim 11, wherein said BST high dielectric thin film material is doped with Ti.

14. The method according to claim 13, wherein said BST high dielectric thin film material is doped with Ti to maintain a Ti percentage of from about 50% to about 53.5% throughout said BST high dielectric thin film material.

15. The method according to claim 14, wherein the ratio of Ba to Sr is about 70:30.

16. The method according to claim 10, wherein said first and second electrodes are selected from the group consisting of Pt, Ru, Ir, Pd, Au ruthenium oxides, and iridium oxides.

17. The method according to claim 10, wherein said integrated circuit capacitor is fabricated in a DRAM cell.

* * * * *